United States Patent
Nagahama et al.

(10) Patent No.: US 7,083,996 B2
(45) Date of Patent: Aug. 1, 2006

(54) NITRIDE SEMICONDUCTOR DEVICE AND MANUFACTURING METHOD THEREOF

(75) Inventors: Shinichi Nagahama, Anan (JP); Shuji Nakamura, Anan (JP)

(73) Assignee: Nichia Corporation, Tokushima (JP)

( * ) Notice: Subject to any disclaimer, the term of this patent is extended or adjusted under 35 U.S.C. 154(b) by 115 days.

(21) Appl. No.: 10/951,767

(22) Filed: Sep. 29, 2004

(65) Prior Publication Data

US 2005/0054132 A1  Mar. 10, 2005

Related U.S. Application Data

(62) Division of application No. 09/500,288, filed on Feb. 8, 2000, now Pat. No. 6,835,956.

(30) Foreign Application Priority Data

Feb. 9, 1999  (JP) ............... P 11-030990
Nov. 22, 1999  (JP) ............... P 11-331797

(51) Int. Cl.
*H01L 21/00*  (2006.01)

(52) U.S. Cl. ............... 438/46; 438/39; 438/42

(58) Field of Classification Search ............ 438/29, 438/31, 34, 39, 40, 41, 42, 46, 47
See application file for complete search history.

(56) References Cited

U.S. PATENT DOCUMENTS

| | | | | |
|---|---|---|---|---|
| 3,566,215 A | 2/1971 | Heywang | ............ | 317/235 |
| 3,593,191 A | 7/1971 | Henker | ............ | 331/94.5 |
| 3,655,439 A | 4/1972 | Seiter | ............ | 117/212 |
| 3,658,585 A | 4/1972 | Folkmann et al. | ............ | 117/201 |
| 3,704,427 A | 11/1972 | Heywang | ............ | 331/94.5 |
| 3,705,567 A | 12/1972 | Emels | ............ | 118/49 |
| 3,737,737 A | 6/1973 | Heywang et al. | ............ | 317/234 R |
| 3,747,559 A | 7/1973 | Dietze | ............ | 118/48 |
| 3,793,984 A | 2/1974 | Kasper et al. | ............ | 118/48 |
| 3,819,974 A | 6/1974 | Stevenson et al. | ............ | 313/499 |
| 3,853,974 A | 12/1974 | Reuschel et al. | ............ | 264/81 |
| 3,941,647 A | 3/1976 | Druminski | ............ | 156/612 |
| 3,948,693 A | 4/1976 | Weyrich et al. | ............ | 148/171 |
| 3,963,537 A | 6/1976 | Kniepkamp et al. | ............ | 148/175 |
| 3,965,347 A | 6/1976 | Heywang | ............ | 250/211 J |
| 3,974,561 A | 8/1976 | Schnoeller | ............ | 29/611 |
| 4,020,791 A | 5/1977 | Reuschel et al. | ............ | 118/49.1 |

(Continued)

FOREIGN PATENT DOCUMENTS

CA  1325582  12/1993

(Continued)

OTHER PUBLICATIONS

Nakamura et al: "High-power, Long-Lifetime InGaN/GaN/AlGaN-Based Laser Diodes Grown on Pure GaN Substrates," *Jpn J. Appl. Phys.*, vol. 37 (1998) pp. 309-312.

(Continued)

*Primary Examiner*—Kevin M. Picardat
(74) *Attorney, Agent, or Firm*—Nixon & Vanderhye P.C.

(57) ABSTRACT

A nitride semiconductor device includes a GaN substrate having a single-crystal GaN layer at least on its surface and plurality of device-forming layers made of nitride semiconductor. The device-forming layer contacting the GaN substrate has a coefficient of thermal expansion smaller than that of GaN, so that a compressive strain is applied to the device-forming layer. This result in prevention of crack forming in the device-forming layers, and a lifetime characteristics of the nitride semiconductor device is improved.

8 Claims, 4 Drawing Sheets

U.S. PATENT DOCUMENTS

| | | | | |
|---|---|---|---|---|
| 4,062,035 | A | 12/1977 | Winstel | 357/17 |
| 4,098,223 | A | 7/1978 | Ertl et al. | 118/48 |
| 4,102,298 | A | 7/1978 | Dietze et al. | 118/5 |
| 4,108,539 | A | 8/1978 | Gort et al. | 350/201 |
| 4,113,381 | A | 9/1978 | Epstein | 356/5 |
| 4,133,702 | A | 1/1979 | Krimmel | 148/1.5 |
| 4,140,546 | A | 2/1979 | Krimmel | 148/1.5 |
| 4,154,625 | A | 5/1979 | Golovchenko et al. | 148/1.5 |
| 4,170,018 | A | 10/1979 | Runge | 357/17 |
| 4,261,770 | A | 4/1981 | Splittgerber et al. | 148/171 |
| 4,351,695 | A | 9/1982 | Hieber et al. | 156/603 |
| 4,404,265 | A | 9/1983 | Manasevit | 428/689 |
| 4,410,993 | A | 10/1983 | Zschauer | 372/44 |
| 4,423,349 | A | 12/1983 | Nakajima et al. | 313/487 |
| 4,505,765 | A | 3/1985 | Trommer | 148/1.5 |
| 4,521,448 | A | 6/1985 | Sasaki | 427/88 |
| 4,531,142 | A | 7/1985 | Weyrich et al. | 357/17 |
| 4,568,206 | A | 2/1986 | Imazaike | 384/530 |
| 4,596,998 | A | 6/1986 | Krimmel | 357/17 |
| 4,599,244 | A | 7/1986 | Falckenberg et al. | 427/74 |
| 4,599,245 | A | 7/1986 | Falckenberg et al. | 427/74 |
| 4,604,637 | A | 8/1986 | Ruhle et al. | 357/17 |
| 4,615,766 | A | 10/1986 | Jackson et al. | 156/662 |
| 4,656,636 | A | 4/1987 | Amann et al. | 372/50 |
| 4,661,175 | A | 4/1987 | Kuphal et al. | 148/171 |
| 4,670,093 | A | 6/1987 | Maerz et al. | 156/649 |
| 4,682,337 | A | 7/1987 | Amann | 372/44 |
| 4,683,574 | A | 7/1987 | Heinen | 372/44 |
| 4,722,088 | A | 1/1988 | Wolf | 372/44 |
| 4,740,259 | A | 4/1988 | Heinen | 156/234 |
| 4,742,525 | A | 5/1988 | Heinen et al. | 372/44 |
| 4,744,088 | A | 5/1988 | Heinen et al. | 372/50 |
| 4,746,195 | A | 5/1988 | Auracher et al. | 350/320 |
| 4,763,979 | A | 8/1988 | Heywang | 350/96.2 |
| 4,768,199 | A | 8/1988 | Heinen et al. | 372/36 |
| 4,792,200 | A | 12/1988 | Amann et al. | 350/96.12 |
| 4,792,959 | A | 12/1988 | Mueller et al. | 372/46 |
| 4,818,722 | A | 4/1989 | Heinen | 437/129 |
| 4,829,188 | A | 5/1989 | Shinomiya et al. | 250/483.1 |
| 4,835,575 | A | 5/1989 | Plihal | 357/30 |
| 4,841,344 | A | 6/1989 | Heinen | 357/17 |
| 4,845,723 | A | 7/1989 | Heinen et al. | 372/38 |
| 4,855,118 | A | 8/1989 | Ichinose et al. | 423/301 |
| 4,859,903 | A | 8/1989 | Minematu et al. | 313/487 |
| 4,864,369 | A | 9/1989 | Snyder et al. | 357/17 |
| 4,869,568 | A | 9/1989 | Schimpe | 350/96.12 |
| 4,890,033 | A | 12/1989 | Ichinomiya et al. | 313/487 |
| 4,904,617 | A | 2/1990 | Muschke | 437/129 |
| 4,904,618 | A | 2/1990 | Neumark | 437/150 |
| 4,907,044 | A | 3/1990 | Schellhorn et al. | 357/17 |
| 4,907,534 | A | 3/1990 | Huang et al. | 118/725 |
| 4,911,102 | A | 3/1990 | Manabe et al. | 118/719 |
| 4,918,497 | A | 4/1990 | Edmond | 357/17 |
| 4,929,907 | A | 5/1990 | Berkel | 330/252 |
| 4,944,837 | A | 7/1990 | Nishikawa et al. | 156/646 |
| 4,945,394 | A | 7/1990 | Palmour et al. | 357/34 |
| 4,946,547 | A | 8/1990 | Palmour et al. | 156/643 |
| 4,947,218 | A | 8/1990 | Edmond et al. | 357/13 |
| 4,959,174 | A | 9/1990 | Nakajima et al. | 252/301.6 R |
| 4,960,728 | A | 10/1990 | Schaake et al. | 437/82 |
| 4,966,862 | A | 10/1990 | Edmond | 437/100 |
| 4,971,739 | A | 11/1990 | Ichinose et al. | 264/61 |
| 4,977,567 | A | 12/1990 | Hanke | 372/45 |
| 4,982,314 | A | 1/1991 | Miki | 363/16 |
| 4,985,742 | A | 1/1991 | Pankove | 357/34 |
| 4,987,576 | A | 1/1991 | Heinen | 372/46 |
| 4,990,466 | A | 2/1991 | Shieh et al. | 437/129 |
| 4,990,990 | A | 2/1991 | Albrecht et al. | 357/30 |
| 5,005,057 | A | 4/1991 | Izumiya et al. | 357/17 |
| 5,006,908 | A | 4/1991 | Matsuoka et al. | 357/17 |
| 5,008,735 | A | 4/1991 | Edmond et al. | 357/74 |
| 5,008,789 | A | 4/1991 | Arai et al. | 362/255 |
| 5,019,746 | A | 5/1991 | Merg | 313/512 |
| 5,023,686 | A | 6/1991 | Helmut et al. | 357/30 |
| 5,027,168 | A | 6/1991 | Edmond | 357/17 |
| 5,034,956 | A | 7/1991 | Gessner et al. | 372/45 |
| 5,041,334 | A | 8/1991 | Nakajima et al. | 428/407 |
| 5,042,043 | A | 8/1991 | Hatano et al. | 372/45 |
| 5,045,896 | A | 9/1991 | Ash et al. | 357/17 |
| 5,049,779 | A | 9/1991 | Itsuki et al. | 313/486 |
| 5,061,972 | A | 10/1991 | Edmond | 357/13 |
| 5,065,207 | A | 11/1991 | Heinen | 357/30 |
| 5,077,145 | A | 12/1991 | Shinomiya et al. | 428/691 |
| 5,093,576 | A | 3/1992 | Edmond et al. | 250/370.01 |
| 5,119,540 | A | 6/1992 | Kong et al. | 29/25.01 |
| 5,120,619 | A | 6/1992 | Nakajima et al. | 428/690 |
| 5,122,845 | A | 6/1992 | Manabe et al. | 357/17 |
| 5,128,955 | A | 7/1992 | Danielmeyer | 372/94 |
| 5,146,465 | A | 9/1992 | Khan et al. | 372/45 |
| 5,155,062 | A | 10/1992 | Coleman | 437/100 |
| 5,171,370 | A | 12/1992 | Reithmaier et al. | 118/726 |
| 5,182,670 | A | 1/1993 | Khan et al. | 359/359 |
| 5,184,247 | A | 2/1993 | Schimpe | 359/344 |
| 5,185,207 | A | 2/1993 | Furuoka et al. | 428/404 |
| 5,200,022 | A | 4/1993 | Kong et al. | 156/612 |
| 5,202,777 | A | 4/1993 | Sluzky et al. | 359/50 |
| 5,205,905 | A | 4/1993 | Kotaki et al. | 156/662 |
| 5,208,878 | A | 5/1993 | Thulke | 385/14 |
| 5,210,051 | A | 5/1993 | Carter, Jr. | 437/107 |
| 5,218,216 | A | 6/1993 | Manabe et al. | 257/103 |
| 5,229,626 | A | 7/1993 | Ebitani et al. | 257/84 |
| 5,233,204 | A | 8/1993 | Fletcher et al. | 257/13 |
| 5,239,188 | A | 8/1993 | Takeuchi et al. | 257/76 |
| 5,247,533 | A | 9/1993 | Okazaki et al. | 372/45 |
| 5,250,366 | A | 10/1993 | Nakajima et al. | 428/690 |
| 5,252,499 | A | 10/1993 | Rothschild | 437/22 |
| 5,252,839 | A | 10/1993 | Fouquet | 257/13 |
| 5,260,960 | A | 11/1993 | Amann et al. | 372/46 |
| 5,264,713 | A | 11/1993 | Palmour | 257/77 |
| 5,266,503 | A | 11/1993 | Wang et al. | 437/24 |
| 5,270,554 | A | 12/1993 | Palmour | 257/77 |
| 5,272,108 | A | 12/1993 | Kozawa | 437/127 |
| 5,278,433 | A | 1/1994 | Manabe et al. | 257/103 |
| 5,281,830 | A | 1/1994 | Kotaki et al. | 257/86 |
| 5,290,393 | A | 3/1994 | Nakamura | 156/613 |
| 5,306,662 | A | 4/1994 | Nakamura et al. | 437/107 |
| 5,312,560 | A | 5/1994 | Somatomo et al. | 252/301.4 S |
| 5,323,022 | A | 6/1994 | Glass et al. | 257/77 |
| 5,330,791 | A | 7/1994 | Aihara et al. | 427/215 |
| 5,334,277 | A | 8/1994 | Nakamura | 117/102 |
| 5,336,080 | A | 8/1994 | Sumitomo et al. | 428/407 |
| 5,338,944 | A | 8/1994 | Edmond et al. | 257/76 |
| 5,341,390 | A | 8/1994 | Yamada et al. | 372/45 |
| 5,343,316 | A | 8/1994 | Morimoto et al. | 359/50 |
| 5,344,791 | A | 9/1994 | Huang | 437/126 |
| 5,359,345 | A | 10/1994 | Hunter | 345/102 |
| 5,363,390 | A | 11/1994 | Yang et al. | 372/22 |
| 5,366,834 | A | 11/1994 | Yoneda et al. | 430/23 |
| 5,369,289 | A | 11/1994 | Tamaki et al. | 257/99 |
| 5,376,303 | A | 12/1994 | Royce et al. | 252/301.4 R |
| 5,376,580 | A | 12/1994 | Kish et al. | 437/127 |
| 5,381,103 | A | 1/1995 | Edmond et al. | 324/753 |
| 5,382,822 | A | 1/1995 | Stein | 257/410 |
| 5,389,571 | A | 2/1995 | Takeuchi et al. | 437/133 |
| 5,390,210 | A | 2/1995 | Fouquet et al. | 372/92 |
| 5,393,993 | A | 2/1995 | Edmond et al. | 257/77 |
| 5,394,005 | A | 2/1995 | Brown et al. | 257/461 |
| 5,403,774 | A | 4/1995 | Shieh et al. | 437/129 |
| 5,404,282 | A | 4/1995 | Klinke et al. | 362/249 |
| 5,408,120 | A | 4/1995 | Manabe et al. | 257/431 |
| 5,409,859 | A | 4/1995 | Glass et al. | 437/187 |
| 5,416,342 | A | 5/1995 | Edmond et al. | 257/76 |
| 5,417,886 | A | 5/1995 | Tateiwa et al. | 252/301.4 R |
| 5,433,169 | A | 7/1995 | Nakamura | 117/102 |

| | | | | | | |
|---|---|---|---|---|---|---|
| 5,433,533 A | 7/1995 | Imazaike ................... 384/488 | 5,776,837 A | 7/1998 | Palmour ..................... 438/767 |
| 5,433,888 A | 7/1995 | Okada et al. ......... 252/301.4 R | 5,777,350 A | 7/1998 | Nakamura et al. ............ 257/96 |
| 5,435,938 A | 7/1995 | Bando et al. ......... 252/301.4 S | 5,777,433 A | 7/1998 | Lester et al. .................. 313/512 |
| 5,438,198 A | 8/1995 | Ebitani et al. .............. 250/330 | 5,779,924 A | 7/1998 | Krames et al. ................ 216/24 |
| 5,459,107 A | 10/1995 | Palmour ..................... 437/238 | 5,780,120 A | 7/1998 | Belouet et al. ............. 427/554 |
| 5,465,249 A | 11/1995 | Cooper, Jr. et al. ........ 365/149 | 5,785,404 A | 7/1998 | Wiese ........................ 362/32 |
| 5,467,291 A | 11/1995 | Fan et al. ................... 364/578 | 5,793,054 A | 8/1998 | Nido ........................... 257/18 |
| 5,468,678 A | 11/1995 | Nakamura et al. .......... 437/107 | 5,793,062 A | 8/1998 | Kish, Jr. et al. .............. 257/98 |
| 5,475,241 A | 12/1995 | Harrah et al. ................ 257/99 | 5,805,624 A | 9/1998 | Yang et al. ................... 372/45 |
| 5,497,012 A | 3/1996 | Moll ....................... 257/183 | 5,808,323 A | 9/1998 | Spaeth et al. ................. 257/88 |
| 5,502,316 A | 3/1996 | Kish et al. .................... 257/94 | 5,808,592 A | 9/1998 | Mizutani et al. ............. 345/83 |
| 5,506,421 A | 4/1996 | Palmour ....................... 257/77 | 5,809,050 A | 9/1998 | Baldwin et al. ............. 372/43 |
| 5,511,084 A | 4/1996 | Amann ........................ 372/20 | 5,811,319 A | 9/1998 | Koike et al. ................... 438/46 |
| 5,514,627 A | 5/1996 | Lowery et al. .............. 437/209 | 5,811,931 A | 9/1998 | Mueller-Mach et al. .... 313/512 |
| 5,523,018 A | 6/1996 | Okada et al. ......... 252/301.4 P | 5,812,105 A | 9/1998 | Van de Ven .................. 345/83 |
| 5,523,589 A | 6/1996 | Edmond et al. ............... 257/77 | 5,812,570 A | 9/1998 | Spaeth ........................ 372/36 |
| 5,539,217 A | 7/1996 | Edmond et al. ............... 257/77 | 5,814,870 A | 9/1998 | Spaeth ....................... 257/433 |
| 5,563,422 A | 10/1996 | Nakamura et al. ........... 257/13 | 5,818,861 A | 10/1998 | Tan et al. ..................... 372/46 |
| 5,578,839 A | 11/1996 | Nakamura et al. ............ 257/96 | 5,828,684 A | 10/1998 | Van De Walle ............... 372/45 |
| 5,583,879 A | 12/1996 | Yamazaki et al. ........... 372/45 | 5,831,288 A | 11/1998 | Singh et al. ................... 257/77 |
| 5,585,648 A | 12/1996 | Tischler ....................... 257/77 | 5,835,514 A | 11/1998 | Yuen et al. ................... 372/36 |
| 5,587,593 A | 12/1996 | Koide et al. .................. 257/94 | 5,835,522 A | 11/1998 | King et al. ................... 372/97 |
| 5,592,501 A | 1/1997 | Edmond et al. ............. 372/45 | 5,837,561 A | 11/1998 | Kish, Jr. et al. .............. 438/47 |
| 5,592,578 A | 1/1997 | Ruh ........................... 385/31 | 5,838,706 A | 11/1998 | Edmond et al. ............. 372/45 |
| 5,596,595 A | 1/1997 | Tan et al. ..................... 372/96 | 5,838,707 A | 11/1998 | Ramdani et al. ............. 372/45 |
| 5,604,135 A | 2/1997 | Edmond et al. .............. 437/22 | 5,838,708 A | 11/1998 | Lin et al. ..................... 372/50 |
| 5,604,763 A | 2/1997 | Kato et al. ................... 372/45 | 5,846,844 A | 12/1998 | Akasaki et al. .............. 437/21 |
| 5,612,260 A | 3/1997 | Palmour ..................... 437/238 | 5,847,507 A | 12/1998 | Butterworth et al. ........ 313/512 |
| 5,614,736 A | 3/1997 | Neumann et al. ........... 257/102 | 5,850,410 A | 12/1998 | Kuramata ..................... 372/43 |
| 5,616,177 A | 4/1997 | Yamada ....................... 117/102 | 5,855,924 A | 1/1999 | Lumbard ..................... 425/116 |
| 5,620,557 A | 4/1997 | Manabe et al. ............. 438/507 | 5,858,277 A | 1/1999 | Chau et al. ............ 252/301.4 F |
| 5,621,749 A | 4/1997 | Baney ......................... 372/69 | 5,859,496 A | 1/1999 | Murazaki et al. ............ 313/485 |
| 5,625,202 A | 4/1997 | Chai ........................... 257/94 | 5,861,190 A | 1/1999 | Greene et al. ............ 427/248.1 |
| 5,627,244 A | 5/1997 | Sato ............................ 526/92 | 5,861,713 A | 1/1999 | Kondo et al. ................ 313/495 |
| 5,629,531 A | 5/1997 | Palmour ....................... 257/77 | 5,862,167 A | 1/1999 | Sassa et al. ................... 372/45 |
| 5,631,190 A | 5/1997 | Negley ........................ 438/33 | 5,867,516 A | 2/1999 | Corzine et al. ............... 372/45 |
| 5,635,146 A | 6/1997 | Singh et al. ................... 423/65 | 5,868,837 A | 2/1999 | Disalvo et al. .............. 117/952 |
| 5,642,375 A | 6/1997 | King et al. ................... 372/97 | 5,877,558 A | 3/1999 | Nakamura et al. ........... 257/749 |
| 5,650,641 A | 7/1997 | Sassa et al. ................... 257/88 | 5,879,587 A | 3/1999 | Yale ...................... 252/301.45 |
| 5,652,434 A | 7/1997 | Nakamura et al. ........... 257/13 | 5,879,588 A | 3/1999 | Yale ...................... 252/301.45 |
| 5,652,438 A | 7/1997 | Sassa et al. ................... 257/94 | 5,880,486 A | 3/1999 | Nakamura et al. ............ 257/96 |
| 5,656,832 A | 8/1997 | Ohba et al. ................. 257/190 | 5,889,802 A | 3/1999 | Walker ........................ 372/31 |
| 5,659,568 A | 8/1997 | Wang et al. ................... 372/96 | 5,889,806 A | 3/1999 | Nagai et al. .................. 372/45 |
| 5,661,074 A | 8/1997 | Tischler ....................... 438/32 | 5,892,784 A | 4/1999 | Tan et al. ..................... 372/43 |
| 5,661,316 A | 8/1997 | Kish, Jr. et al. ............. 257/190 | 5,892,787 A | 4/1999 | Tan et al. ..................... 372/96 |
| 5,661,742 A | 8/1997 | Huang et al. ................ 372/46 | 5,900,650 A | 5/1999 | Nitta ............................ 257/94 |
| 5,670,798 A | 9/1997 | Schetzina .................... 257/96 | 5,905,276 A | 5/1999 | Manabe et al. .............. 257/103 |
| 5,679,153 A | 10/1997 | Dmitriev et al. ............ 117/106 | 5,907,151 A | 5/1999 | Gramann et al. ......... 250/214.1 |
| 5,684,623 A | 11/1997 | King et al. ................. 359/346 | 5,912,477 A | 6/1999 | Negley ........................ 257/95 |
| 5,686,737 A | 11/1997 | Allen ........................... 257/77 | 5,917,202 A | 6/1999 | Haitz et al. ................... 257/98 |
| 5,700,713 A | 12/1997 | Yamazaki et al. ........... 437/129 | 5,919,422 A | 7/1999 | Yamanaka et al. ........... 422/121 |
| 5,707,139 A | 1/1998 | Haitz ....................... 362/231 | 5,920,766 A | 7/1999 | Floyd .......................... 438/35 |
| 5,718,760 A | 2/1998 | Carter et al. ................ 117/84 | 5,923,053 A | 7/1999 | Jakowetz et al. ............. 257/95 |
| 5,719,409 A | 2/1998 | Singh et al. ................... 257/77 | 5,923,118 A | 7/1999 | Jennato et al. ............. 313/485 |
| 5,724,062 A | 3/1998 | Hunter ....................... 345/102 | 5,923,690 A | 7/1999 | Kume et al. .................. 372/46 |
| 5,724,373 A | 3/1998 | Chang ......................... 372/20 | 5,923,946 A | 7/1999 | Negley ........................ 438/4 |
| 5,724,376 A | 3/1998 | Kish, Jr. et al. .............. 372/96 | 5,925,898 A | 7/1999 | Spath ........................ 257/98 |
| 5,727,014 A | 3/1998 | Wang et al. ................... 372/96 | 5,927,995 A | 7/1999 | Chen et al. .................. 438/517 |
| 5,729,029 A | 3/1998 | Rudaz ........................ 257/13 | 5,935,705 A | 8/1999 | Chen et al. .................. 428/367 |
| 5,729,567 A | 3/1998 | Nakagawa .................. 372/99 | 5,936,985 A | 8/1999 | Yamamoto et al. ........... 372/38 |
| 5,733,796 A | 3/1998 | Manabe et al. ............. 437/127 | 5,945,689 A | 8/1999 | Koike et al. ................... 257/88 |
| 5,734,182 A | 3/1998 | Nakamura et al. ............ 257/96 | 5,953,361 A | 9/1999 | Borchert et al. .............. 372/96 |
| 5,739,552 A | 4/1998 | Kimura et al. ................ 257/89 | 5,953,581 A | 9/1999 | Yamasaki et al. ............ 438/22 |
| 5,739,554 A | 4/1998 | Edmond et al. ............. 257/103 | 5,958,295 A | 9/1999 | Yale ...................... 252/301.4 S |
| 5,741,431 A | 4/1998 | Shih ........................... 216/65 | 5,959,316 A | 9/1999 | Lowery ....................... 257/98 |
| 5,741,724 A | 4/1998 | Ramdani et al. ............ 437/128 | 5,959,401 A | 9/1999 | Asami et al. ................ 313/503 |
| 5,742,133 A | 4/1998 | Wilhelm et al. ............. 315/291 | 5,964,943 A | 10/1999 | Stein et al. .................... 117/88 |
| 5,747,832 A | 5/1998 | Nakamura et al. ............ 257/103 | 5,966,393 A | 10/1999 | Hide et al. .................... 372/23 |
| 5,753,939 A | 5/1998 | Sassa et al. ................... 257/94 | 5,968,265 A | 10/1999 | Stein et al. .................... 117/71 |
| 5,758,951 A | 6/1998 | Haitz ......................... 362/259 | 5,969,378 A | 10/1999 | Singh ......................... 257/77 |
| 5,761,229 A | 6/1998 | Baldwin et al. ............. 372/31 | 5,972,781 A | 10/1999 | Wegleiter et al. ............ 438/460 |
| 5,767,581 A | 6/1998 | Nakamura et al. .......... 257/749 | 5,972,801 A | 10/1999 | Lipkin et al. ................ 438/770 |
| 5,771,254 A | 6/1998 | Baldwin et al. ............. 372/31 | 5,973,336 A | 10/1999 | Hanke et al. ................. 257/94 |

| | | | |
|---|---|---|---|
| 5,980,631 A | 11/1999 | Tews et al. ............... 117/89 |
| 5,981,945 A | 11/1999 | Spaeth et al. ............ 250/239 |
| 5,981,979 A | 11/1999 | Brunner ................... 257/99 |
| 5,982,970 A | 11/1999 | Schneider ................ 385/125 |
| 5,986,317 A | 11/1999 | Wiese ...................... 257/433 |
| 5,991,160 A | 11/1999 | Lumbard .................. 361/760 |
| 5,994,722 A | 11/1999 | Averbeck et al. .......... 257/89 |
| 5,998,925 A | 12/1999 | Shimizu et al. .......... 313/503 |
| 5,999,552 A | 12/1999 | Bogner et al. ............ 372/43 |
| 6,046,464 A | 4/2000 | Schetzina |
| 6,051,849 A | 4/2000 | Davis et al. |
| 6,121,121 A | 9/2000 | Koide |
| 6,177,292 B1 | 1/2001 | Hong et al. |
| 6,194,742 B1 | 2/2001 | Kern et al. |
| 6,252,894 B1* | 6/2001 | Sasanuma et al. ....... 372/45.01 |
| 6,497,944 B1* | 12/2002 | Oku et al. ................. 257/94 |
| 6,806,109 B1* | 10/2004 | Furuya et al. ............. 438/22 |
| 6,849,864 B1* | 2/2005 | Nagahama et al. ........ 257/22 |
| 6,861,271 B1* | 3/2005 | Chua et al. ................ 438/22 |
| 6,887,726 B1* | 5/2005 | Kimura .................... 438/22 |

FOREIGN PATENT DOCUMENTS

| | | |
|---|---|---|
| DE | 196 48 955 A1 | 5/1997 |
| EP | 0356059 A2 | 2/1990 |
| EP | 0356059 A3 | 2/1990 |
| EP | 0380340 A2 | 8/1990 |
| EP | 0380340 A3 | 8/1990 |
| EP | 0637069 A1 | 2/1995 |
| EP | 0731512 A2 | 9/1996 |
| EP | 0731512 A3 | 7/1997 |
| EP | 0781619 A1 | 7/1997 |
| EP | 0 874 405 | 10/1998 |
| EP | 0871208 A2 | 10/1998 |
| EP | 0880181 A2 | 11/1998 |
| EP | 0871208 A3 | 12/1998 |
| EP | 0880181 A3 | 1/1999 |
| EP | 0905799 A2 | 3/1999 |
| EP | 0936682 A1 | 8/1999 |
| FR | 2613136 | 9/1988 |
| GB | 2322737 A | 3/1998 |
| GB | 2323210 A | 9/1998 |
| JP | 04144294 | 5/1992 |
| JP | 05152609 | 6/1993 |
| JP | 5-243614 | 9/1993 |
| JP | 0766192 | 3/1995 |
| JP | 7176794 | 7/1995 |
| JP | 8-64791 | 3/1996 |
| JP | 1064854 | 7/1996 |
| JP | 10233529 | 2/1997 |
| JP | 9-83016 | 3/1997 |
| JP | 09180998 | 7/1997 |
| JP | 09193137 | 7/1997 |
| JP | 09246651 | 9/1997 |
| JP | 09260772 | 10/1997 |
| JP | 09293935 | 11/1997 |
| JP | 09321338 A | 12/1997 |
| JP | 10242565 | 9/1998 |
| JP | 10256645 | 9/1998 |
| JP | 10270792 | 10/1998 |
| JP | 10290027 | 10/1998 |
| JP | 10294529 | 11/1998 |
| JP | 10321962 | 12/1998 |
| JP | 11040893 | 2/1999 |
| JP | 11-145516 | 5/1999 |
| JP | 3036495 | 5/1999 |
| JP | 2000-31599 | 1/2000 |
| WO | WO9702478 A1 | 1/1997 |
| WO | WO9702610 A1 | 1/1997 |
| WO | WO9717730 A1 | 5/1997 |
| WO | WO9727629 A1 | 7/1997 |
| WO | WO9739485 A1 | 10/1997 |
| WO | WO9750132 A1 | 12/1997 |
| WO | WO9805078 A1 | 2/1998 |
| WO | WO9812757 A1 | 3/1998 |
| WO | WO9834304 A1 | 8/1998 |
| WO | WO9837586 A1 | 8/1998 |
| WO | WO9842879 A1 | 10/1998 |
| WO | WO9842897 A1 | 10/1998 |
| WO | WO9847185 A1 | 10/1998 |
| WO | WO9849731 A1 | 11/1998 |
| WO | WO9857378 A1 | 12/1998 |
| WO | WO9910936 A2 | 3/1999 |
| WO | WO9910936 A3 | 3/1999 |
| WO | WO9918617 A1 | 4/1999 |

OTHER PUBLICATIONS

"InGaN/GaN/AlGaN-based laser diodes with modulation-doped strained-layer superlattices grown on an epitaxially laterally overgrown GaN substrate," Shuji Nakamura et al., Applied Physics Letter, vol. 72, No. 2, Jan. 12, 1998.

"Novel Metalorganic Chemical Vapor Deposition System for GaN Growth," S. Nakamura, American Institute of Physics, pp. 2021-2023, May 6, 1991.

"Out of the Blue," Forbes Global Magazine, pp. 66-71, Sep. 6, 1999.

"Nitride PN Junctions Grown on SiC Substrates," V.A. Dmitriev, Inst. Phys. Conf., pp. 1019-1022, 1996.

"AlGaN PN Junctions," V.A. Dmitriev, American Inst. of Physics, pp. 115-117, May 11, 1995.

"Effects of Ar Ion Laser Irradiation on MOVPE of ZnSe using DMZn and DMSe as Reactants," A. YoshikawaJournal of Crystal Growth, pp. 653-658, 1991.

"Electric Breakdown in GaN P-N Junctions," V.A. Dmitriev, American Inst. of Physics, pp. 229-231, Jan. 8, 1996.

"High Quality GaN Grown Directly on SiC by Halide Vapour Phase Epitaxy," Y.V. Melnik, Inst. Phys. Conf., pp. 863-866, 1996.

"Luminescence Conversion of Blue Light Emitting Diodes," P. Schlotter, Journal of Applied Physics, pp. 12-13, Feb. 27, 1997.

"P-Type Conduction in Mg-Doped GaN Treated with Low-Energy Electron Beam Irradiation (LEEBI)," H. Amano, Japanese Journal of Applied Physics, pp. 2112-2114, Dec. 1989.

"Photoluminescence of Mg-Doped P-Type GaN and Electroluminescence of GaN P-N Junction Led," I. Akasaki, Journal of Luminescence vol. 48-49, pp. 666-670, 1991.

"Recent Progress in AlGaN/GaN Laser Structures on 6H-SiC," G.E. Bulman, SPIE vol. 2693, pp. 57-63, 1996.

"Recent Progress in GaN/SiC LEDs and Photopumped Lasers," G.E. Bulman, pp. 100-101, 19xx.

"Role of Growth Initiation for High-Brightness GaN-Based Light Emitting Diodes," R.S. Kern, 2nd. Intern. Symp. on Blue Laser and Light Emitting Diodes, Chiba, Japan, Sep. 29-Oct. 2, 1998.

"The State of SiC: GaN-Based Blue LEDs," J. Edmond, Inst. Phys. Conf. Ser. No. 142, Chap. 6, pp. 991-994, 1996.

"Wide Bandgap Group-III Nitride Optoelectronics," http://www.phy.duke.edu/research/photon/terahertz/gan/index.html.

"White LED Production at Osram," G. Bogner, Compound Semiconductor, pp. 28-31, May 1999.

US 5,961,723, 10/1999, Roithner et al. (withdrawn)

* cited by examiner

NITRIDE SEMICONDUCTOR DEVICE AND MANUFACTURING METHOD THEREOF

CROSS-REFERENCE TO THE RELATED APPLICATION

This application is a division of application Ser. No. 09/500,288, filed Feb. 8, 2000 now U.S. Pat. No. 6,835,956, the entire content of each of which is hereby incorporated by reference in this application.

TECHNICAL FIELD OF THE INVENTION

This invention relates to a device provided with a nitride semiconductor ($In_xAl_yGa_{1-x-y}N$, $0 \leq x$, $0 \leq y$, $x+y \leq 1$) including light emitting diode (LED), laser diode (LD), or other electronic devices and power devices. Particularly, the present invention relates to a prevention of a small cracking in nitride semiconductor layers, which occurs in the nitride semiconductor device using a GaN substrate.

BACKGROUND OF THE INVENTION

Blue LEDs using nitride semiconductors have already been provided for practical use. Recently, it becomes possible to provide a practical blue laser diode made of nitride semiconductor by using a GaN substrate.

The inventors have disclosed a nitride semiconductor laser diode using a GaN substrate in, for example, Japanese Journal of Applied Physics. Vol.37(1998) pp.L309–L312. The GaN substrate can be formed, for example, by the following method: A GaN layer is formed on a sapphire substrate and a protective film made of $SiO_2$ is formed partially on the surface of the GaN film. Then, GaN is grown again on the GaN film and the sapphire substrate is removed. The secondly-formed GaN layer grows mainly in a lateral direction, so that a proceeding of dislocations is prevented. By using this method, a GaN substrate having low dislocation density can be obtained. The nitride semiconductor laser device made with such a low dislocation-density GaN substrate showed continuous-wave oscillation and can be operated continuously for more than ten thousand hours.

DISCLOSURE OF THE INVENTION

The nitride semiconductor laser diode with lifetime of more than ten thousand hours can be applied for practical use. However, in some applications, much longer lifetime is desired. The inventors examined the nitride semiconductor laser device obtained by the above-described method and found that extremely small cracks tend to occur in the nitride semiconductor layers grown on the GaN substrate, particularly in the n-type GaN contact layer which is grown directly on the GaN substrate. The crack is too small to observe by a typical optical microscope, however, it can be observed by a fluorescence microscope. It is a surprising fact that small cracks tend to occur in the GaN layer which is directly grown on the same-composition GaN substrate. It is supposed that the occurrence of small cracks is a specific phenomenon for the GaN substrate which is manufactured by the lateral-growth method. However, it is also supposed that when a thin-film GaN is grown on a thick GaN substrate, small cracks occur for an unknown reason. In any case, it is probable that the small cracks cause an increase of thresholds and a deterioration of lifetime of the laser device. The small cracks may also cause a decrease in reliability for other nitride semiconductor devices, as well as in the laser device.

Therefore, the object of the present invention is to reduce extremely small cracks in the nitride semiconductor layers and to extend a lifetime of the nitride semiconductor device using a GaN substrate, thus improving a reliability of the nitride semiconductor device. For this purpose, the nitride semiconductor device of the present invention is characterized in that, among device-forming layers (=nitride semiconductor layers) formed on the GaN substrate, the device-forming layer which is directly grown on the Gan substrate is provided with compressive strain to reduce the small cracks.

The compressive strain may be achieved by forming a device-forming layer having a smaller coefficient of thermal expansion than that of GaN directly on the GaN substrate. The device-forming layer directly grown on the GaN substrate is preferably $Al_aGa_{1-a}N$, ($0<a \leq 1$). Because $Al_aGa_{1-a}N$, ($0<a \leq 1$) has a smaller coefficient of thermal expansion than that of GaN and can be grown on the GaN substrate as a good crystalline.

The device structure constructed by the device-forming layers preferably comprises an n-type cladding layer containing Al, an active layer containing InGaN and a p-type cladding layer containing Al. Employing this structure together with the cracks-reducing structure, a good-characteristics device is provided.

The device-forming layer directly grown on the GaN substrate, for example $Al_aGa_{1-a}N$ layer, may play various kinds of rolls according to the device structure. For instance, the layer may be an buffer layer for preventing small cracks, or an n-contact layer. When the whole GaN substrate is electrically conductive, the layer may be an n-clad layer.

The GaN substrate is preferably manufactured by using the lateral-growth method. By using the laterally grown GaN substrate, not only the occurrence of the small cracks but also a propagation of dislocations is prevented. Thus, a nitride semiconductor device having good characteristics is provided.

The manufacturing method of the nitride semiconductor element of the present invention comprises the steps of:

(a) forming a first nitride semiconductor layer on a auxiliary substrate made of different material from nitride semiconductor, for example sapphire or SiC;

(b) forming a stripe-shaped or island-shaped periodical concave-convex structure on said first nitride semiconductor layer;

(c) forming a single-crystal GaN layer on said first nitride semiconductor layer to make a GaN substrate; and (d) forming a second nitride semiconductor layer on said GaN substrate, the second nitride semiconductor layer having a coefficient of thermal expansion smaller than that of GaN.

Further, the auxiliary substrate may be removed from the GaN substrate after forming the single-crystal GaN layer.

According to the present invention, a thermal expansion coefficient of the nitride layer contacting on the GaN substrate is preferably smaller than that of GaN so as to provide the compressive strain in the nitride semiconductor layer. The compressive strain prevents formation of small cracks in the nitride semiconductor layers. The reasons why this effect is obtained can be described as follows: For example, when coefficients of thermal expansion of Si, GaN and sapphire are $\epsilon_1$, $\epsilon_2$, $\epsilon_3$, respectively, the relation of $\epsilon_1 < \epsilon_2 < \epsilon_3$ stands up. When GaN is grown on the SiC substrate, cracks are liable to occur in the GaN layer. In this case, the relation of coefficients of thermal expansion is $\epsilon_1 < \epsilon_2$ and a tensile strain is laid in the in-plane direction on the GaN layer grown on the SiC substrate. On the other hand, when GaN is grown on the sapphire substrate, cracks are not liable to occur in the GaN layer. In this case, the relation of coefficients of thermal expansion is $\epsilon_2 < \epsilon_3$ and a compressive strain is laid in the in-plane direction on the GaN layer grown on the sapphire substrate. In short, the liability of cracks to occur depends on whether the strain laid on the layer is a tensile strain or a compressive strain. When the coefficient of thermal expansion of the layer grown on the substrate is smaller than that of the substrate, a compressive strain is laid on the layer and formation of cracks can be prevented.

When GaN is grown on the GaN substrate, neither tensile strain nor compressive strain must be laid on the grown GaN layer. However, small cracks tend to occur in the grown GaN. It is supposed that, when a nitride semiconductor layer is grown on a GaN substrate, small cracks occurs in the nitride semiconductor layer if the thermal expansion coefficient of the layer is equal or greater than that of GaN, and that the formation of the cracks is suppressed if the thermal expansion coefficient of the layer is smaller than that of GaN and compressive strain is laid on the layer.

In this specification, the term "GaN substrate" refers to a substrate having a low-dislocation-density single-crystal GaN layer on its surface. The GaN substrate may be composed only of a single-crystal GaN layer, or it may be composed of an auxiliary substrate made of different material from nitride semiconductor such as sapphire or SiC and a low-dislocation-density single-crystal GaN layer formed on the auxiliary substrate.

The GaN substrate may be manufactured by any suitable method, as long as a single-crystal GaN formed by the method has low dislocation density enough for forming electric devices thereon. It is preferable to use a growing method in which a single-crystal GaN layer is formed via a lateral-growth process. The lateral-growth process suppresses a dislocation propagation into the single-crystal GaN layer, and a low-dislocation-density GaN substrate is obtained. The term "the lateral-growth process" includes any process in which a single-crystal GaN layer grows not only in a vertical direction but also in a parallel direction to the substrate surface to suppress a propagation of dislocation in the vertical direction.

For manufacturing the GaN substrate via the lateral-growth, ELOG growth methods as disclosed in U.S. Ser. No. 09/202,141, Japanese patent Laid-Open Publication No. H11-312825, Japanese patent Laid-Open Publication No. H11-340508, Japanese Patent Application No. H 11-37827, Japanese Patent Application No. H11-37826, Japanese Patent Application No. H11-168079, Japanese Patent Application No. H11-218122 and so on may be used, as well as the method as described in the J.J.A.P. wherein GaN is grown laterally using $SiO_2$.

The GaN obtained according to the ELOG growth method as described in each above-mentioned specifications can be a substrate having a low dislocation density and such a substrate is preferable in view of device characteristics such as lifetime. The obtained substrate can be used in the present invention, resulting in much better lifetime property.

Among those methods, the method described in the Japanese Patent Application No. H11-37827 is preferable. A nitride semiconductor layer, such as GaN or AlGaN is grown on a heterogeneous substrate, such as sapphire substrate. A stripe-like or island-like periodical concave-convex structure is formed so that a subsequently grown single-crystal GaN layer grows laterally. Thereafter, a single-crystal GaN is grown to cover the concave-convex structure. By using this method, the single-crystal GaN layer can grow laterally, so that the propagations of dislocations are prevented and a low-dislocation-density GaN substrate is obtained. If a GaN substrate composed only of nitride semiconductor is required, the single-crystal GaN layer is grown thick and, after that, the auxiliary substrate is removed.

Growing a nitride semiconductor layer having a thermal expansion coefficient smaller than that of GaN on a laterally grown single-crystal GaN layer, the occurring of dislocation and small cracks are prevented in the subsequent nitride semiconductor layers. Thus, the reliability of the nitride semiconductor element is improved. The concrete example of the present invention using a laterally grown GaN substrate will be described in the following examples.

In the manufacturing method as described in above-mentioned specifications, the auxiliary substrate is removed after ELOG growth to make a GaN substrate made only of nitride semiconductor. However, the auxiliary substrate may be left after ELOG growth, and, in this case, the substrate is used as a GaN substrate consisting of auxiliary substrate and nitride semiconductor layers.

When the GaN substrate made of only nitride semiconductor is used, an n-electrode can be formed on the back surface, which is opposite to the surface on which the device structure is formed. This minimizes the chip size. Also, when the GaN substrate is made of only nitride semiconductors, a good heat radiation characteristic can be obtained. Further, it becomes easy to form a resonation facet by cleavage. In view of device characteristics, the device structure is preferably formed on the surface opposite to the surface from which the auxiliary substrate is removed.

On the other hand, when the GaN substrate comprising a heterogeneous substrate and nitride semiconductor layers is used, the breakage and chipping of the wafer can be prevented, with the result that good handling properties can be achieved. Moreover, the step of removing the auxiliary substrate can be eliminated and the manufacturing time is shortened. Even when the GaN substrate comprises a heterogeneous substrate, if the substrate is electrically conductive, the n-electrode can be formed on the back surface of the substrate.

Before forming the nitride semiconductor having a smaller coefficient of thermal expansion on the GaN substrate, the surface of the GaN substrate may be etched. Because the surface of the GaN substrate may become uneven during the manufacturing process, it is preferable to grow the nitride semiconductor after the surface of the GaN substrate is made smooth by etching. This treatment further suppresses the occurring of the small cracks.

DETAILED DESCRIPTION OF PREFERRED EMBODIMENTS

Figure 5:
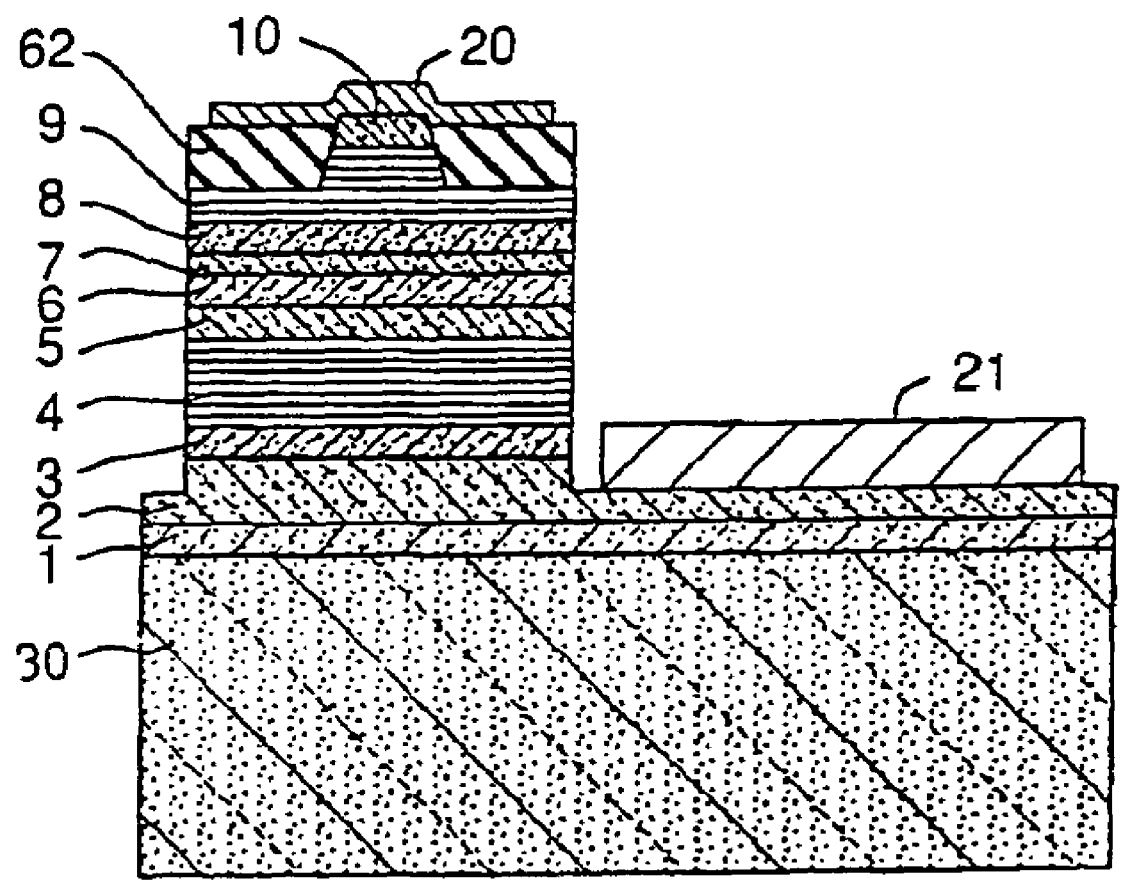
FIG. 5 is a schematic sectional view of the nitride semiconductor laser device according to an embodiment of the present invention.

FIG. 5 is a schematic sectional view of the nitride semiconductor device according to the present invention. Device-forming layers 1~10 is formed to construct a semiconductor laser device on a GaN substrate 30. The device-forming layer 1 which is contacting on the GaN substrate 30 has a smaller coefficient of thermal expansion than that of GaN, so that a compressive strain is laid on the device-forming layer 1 to suppress the occurrence of the small cracks.

According to the present invention, any nitride semiconductor having a coefficient of thermal expansion smaller than that of GaN can be employed as the material for the nitride semiconductor layer which is grown on the GaN substrate. However, it is preferable that the nitride semiconductor material does not have such a composition as spoils crystallinity. For example, $Al_aGa_{1-a}N$, ($0<a \leqq 1$) is preferable. More preferably, the value of a is $0<a<0.3$ and most preferably, the value of a is $0<a<0.1$. The nitride semiconductor having such a composition is preferable to prevent small cracks and also, obtain a good crystallinity.

The surface of the GaN substrate may be etched before the nitride semiconductor layer having a small coefficient of thermal expansion is formed on the GaN substrate. Since the surface of the GaN may be uneven, depending on the manufacturing process of the GaN substrate, it is preferable to form the nitride semiconductor layer having a small coefficient of thermal expansion after the surface of the GaN substrate is made smooth by etching, in view of prevention of small cracks.

The thickness of the nitride semiconductor layer grown directly on the GaN substrate is not limited to a specific value. But the thickness is preferably not less than 1 μm and more preferably, is in a range from 3 to 10 μm. Such a thickness is preferable in view of prevention of small cracks.

The device-forming layer directly grown on the GaN substrate may be a various kinds of function layers in the device, which function depends on the device structure. The thickness of the device-forming layer 1 is controlled adequately according to its function within the above-mentioned range. In the nitride semiconductor device shown in FIG. 5, the device-forming layer 1 functions as a n-type contact layer together with the device-forming layer 2, on which an n-electrode 21 is formed. An n-cladding layer 4 containing Al, an active layer 6 containing InGaN and a p-cladding layer 9 is formed thereon to construct a semiconductor laser device.

If the GaN substrate 30 is an electrically conductive one such as, for example, a substrate having a single-crystal GaN layer formed on SiC or a substrate made only of single-crystal GaN layer, the n-electrode may be formed on the back surface of the GaN substrate. In this case, the device-forming layer 1 contacting on the GaN substrate may be a cladding layer for enclosing light.

When growing the device-forming layer 1 on the GaN substrate, the device-forming layer 1 may be doped with an impurity. Such an impurity may be either n-type or p-type. The amount of the doped impurity is controlled depending on the functions of the nitride semiconductor layer, such as a cladding layer or a contact layer.

In the nitride semiconductor device shown in FIG. 5, an undoped n-type $Al_aGa_{1-a}N$ contact layer 1 is formed as the device-forming layer 1 and an n-type $Al_aGa_{1-a}N$ contact layer 2 is formed thereon. The growth of n-type $Al_aGa_{1-a}N$ contact layer 2 on undoped n-type $Al_aGa_{1-a}N$ is preferable in view of preventing of small cracks and improving crystallinity. In this case, the undoped $Al_aGa_{1-a}N$ layer 1 also functions as a buffer layer and the like. The thickness of the undoped n-type $Al_aGa_{1-a}N$ layer is preferably several μm.

In the case that the n-electrode 21 is formed directly on the device-forming layer 1, the nitride semiconductor layer doped with an n-type impurity (preferably, Si) is grown on the GaN substrate 30 as the device-forming layer 1. The amount of the doped n-type impurity is preferably in a range from $1 \times 10^{18}/cm^3$ to $5 \times 10^{18}/cm^3$. The thickness of the device-forming layer 1 which solely functions as an n-type contact layer is preferably in a range of 1 to 10 μm. The thickness in such a range is preferable to prevent small cracks and can make the nitride semiconductor layer function as an n-type contact layer.

The GaN substrate may be either a substrate made only of nitride semiconductor or a substrate comprising an auxiliary substrate and nitride semiconductor layers. The GaN substrate is preferably manufactured through the lateral-growth process. The use of the GaN substrate manufactured through the lateral-growth process suppresses a generation of dislocations in the device-forming layers 1~10 and improves the device characteristics.

Figure 2:
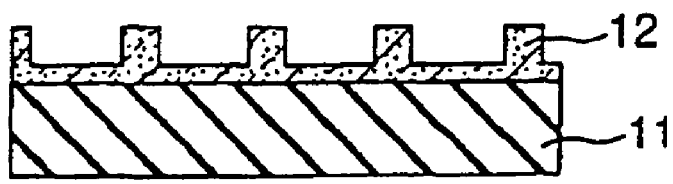
FIG. 2 is a schematic sectional view showing the manufacturing process of the GaN substrate following the process shown in FIG. 1.
Figure 3:
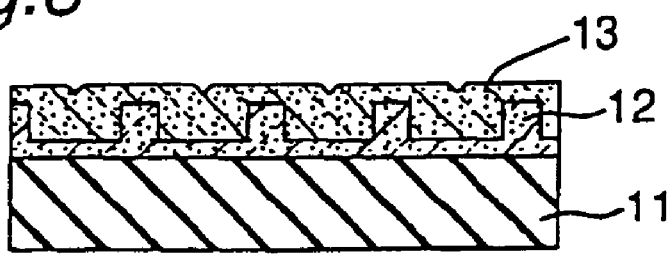
FIG. 3 is a schematic sectional view showing the manufacturing process of the GaN substrate following the process shown in FIG. 2.
Figure 4:
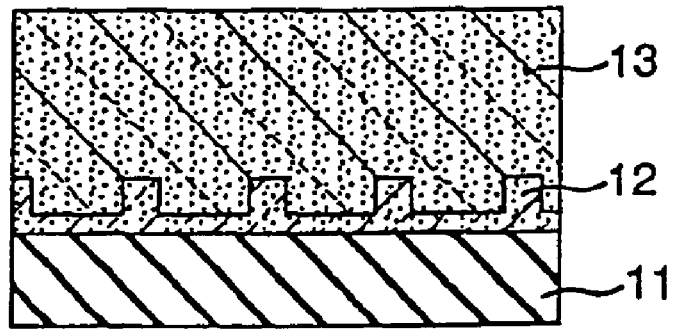
FIG. 4 is a schematic sectional view showing the manufacturing process of the GaN substrate following the process shown in FIG. 3.

For example, the GaN substrate 30 may be manufactured as described below. First, a nitride semiconductor layer 12 such as a GaN or AlGaN layer is formed on an auxiliary substrate 11 made of different material form nitride semiconductor via an adequate buffer layer. The auxiliary substrate is, for example, a sapphire, a SiC or a spinel. As shown in FIG. 2, a periodical stripe-shaped or island-shaped concave-convex structure is formed on the surface of the nitride semiconductor layer 12 so that a single-crystal GaN layer which is subsequently grown thereon grows in the horizontal direction. The stripe-shaped or island-shaped concave-convex structure may be formed so as to leave semiconductor layer 12 as shown in FIG. 2. Alternatively, the concave-convex structure may be formed so as to penetrate the nitride layer 12 and remove a part of the auxiliary substrate 11. Forming concave-convex structure in such a depth as removing the part of the auxiliary substrate 11, a distortion of crystal is suppressed at a point that the single-crystal GaN laterally grown from the convex part meets with each other. This improves the crystallinity of the single-crystal GaN. As a further alternative, the nitride semiconductor 12 may has a two-layer structure of GaN-on-AlGaN, in which concave-convex structure is formed in such a depth that a part of the AlGaN is removed. Next, as shown in FIG. 3 and FIG. 4, a single-crystal GaN 13 is grown over the concave-convex structure of the nitride semiconductor layer 12. In this manner, a GaN substrate comprising nitride semiconductor layers and an auxiliary substrate is obtained. If a GaN substrate made only of nitride semiconductor is required, the single-crystal GaN layer is grown thick by, for example, a HVPE method and, then, the auxiliary substrate 11 such as a sapphire substrate is removed.

When the auxiliary substrate 11 is left in the GaN substrate 30, the thickness of the nitride semiconductor part of the GaN substrate is preferably not more than 100 μm, more preferably not more than 50 μm and most preferably, not more than 20 μm. The lower limit of the thickness may be any value as long as the protective film or the unevenness is covered by ELOG grown GaN to decrease dislocations. For example, the lower limit of the thickness is not less than several μm. When the thickness is within the range, not only dislocations can be decreased, but also, the warp of the wafer due to the difference in coefficients of thermal expansion between the auxiliary substrate and the nitride semiconductor can be prevented, with the result that the device structure can be grown well on the GaN substrate.

When the auxiliary substrate 11 is removed from the GaN substrate 30, the thickness of the GaN substrate made only of nitride semiconductor is not limited to a specific value in the present invention. But the thickness is preferably in a range of 50 to 500 μm and more preferably, in a range of 100 to 300 μm. When the thickness of the GaN substrate is within the above-mentioned range, the dislocations can be decreased and the mechanical strength can be held.

In order to improve the crystallinity of the single-crystal GaN in the substrate, another manufacturing method as described below may be employed. First, as well as in the above-mentioned method, concave-convex structures are formed in a nitride semiconductor layer 12 grown on an auxiliary substrate 11 and a single-crystal GaN layer 13 is formed thickly thereon by the method of HVPE (First growth of single-crystal GaN). Subsequently, a mask made of, for example, $SiO_2$ is formed on the single-crystal GaN layer 13 in a stripe-like or island-like shape periodically, and a single-crystal GaN layer is laterally grown over the mask by the CVD method (Second growth of single-crystal GaN). If the auxiliary substrate 11 must be removed, the removal procedure is preferably done after the first growth of the single-crystal GaN 13. It is preferable that the surface of the firstly grown single-crystal GaN 13 is made smooth by etching before the second growth of the single-crystal GaN.

With the first growth of the single-crystal GaN in which the concave-convex structure is made and the GaN is grown by the HVPE method, a thick single-crystal GaN layer is easily obtained. However, this single-crystal GaN layer is apt to have voids near the concave structure and have an insufficient crystallinity. The second growth of the single-crystal GaN layer by the MOCVD method using the $SiO_2$ mask provides a single-crystal GaN layer having better crystallinity.

When the auxiliary substrate 11 is removed from the GaN 30, the GaN substrate tends to be warped a little. This indicates that the surface of the GaN layer from which the auxiliary substrate is removed is different in physical properties from the grown surface of the GaN layer. The problem of occurring small cracks may be caused by the difference in physical properties of the surfaces. In any case, growing a layer having a small coefficient of thermal expansion, for example $Al_aGa_{1-a}N$, on a GaN substrate, small cracks are prevented and semiconductor device having good crystalinity is obtained.

According to the present invention, the small cracks are prevented by the compressive strain laid on the device-forming layer contacting the GaN substrate. This advantage is obtained in any kind of device. However, the device is preferably a light-emitting device comprising a n-type cladding layer containing Al, an active layer containing InGaN and a p-type cladding layer containing Al. Taking this device structure, with the effect of the prevention of crack forming, a good characteristics device is obtained. For forming the device-forming layer, every method to grow nitride semiconductors which is known, such as MOVPE (metal-organic vapor-phase epitaxy), MOCVD (metal-organic chemical vapor deposition), HVPE (halide vapor-phase epitaxy), MBE (molecular beam epitaxy) and the like, can be used.

Examples of the present invention will be described below. However, the present invention is not to be limited to the examples.

EXAMPLE 1

In Example 1, the nitride semiconductor laser device as shown in FIG. 5 was manufactured.

(Manufacturing Method of the GaN Substrate)

The GaN substrate was manufactured according to each step as shown in FIGS. 1 to 4.

A sapphire substrate 11 of two-inch in diameter having its principal surface represented by a C-face and an orientation flat face represented by an A-face was set in the reactor and the temperature was adjusted to 510° C. A buffer layer (not shown) made of GaN which has a thickness of about 200 angstroms was grown using hydrogen as a carrier gas and ammonia and TMG (trimethylgallium) as a source of GaN on the sapphire substrate.

Figure 1:
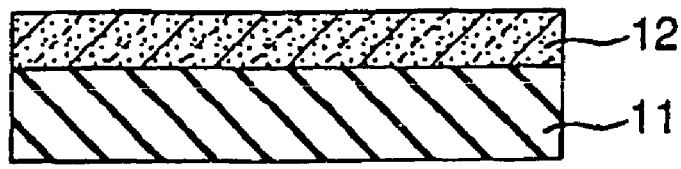
FIG. 1 is a schematic sectional view showing the manufacturing process of the GaN substrate.

After growing the buffer layer, only TMG was stopped and the temperature was increased to 1050° C. At 1050° C., using ammonia and TMG as a source of GaN, a first nitride semiconductor layer 12 made of undoped GaN was grown to the thickness of 2 μm (FIG. 1).

After growing a first nitride semiconductor layer 12, a photo-mask having stripes was formed. Then, the $SiO_2$ film which was patterned to have a stripe width (the upper part of the convex portion) of 5 μm and a stripe distance (the bottom part of the concave portion) of 15 μm was formed with a sputtering apparatus. Subsequently, the first nitride semiconductor layer 12 on which the $SiO_2$ film was not formed was etched with a RIE apparatus to the extent that the nitride semiconductor 12 remained, so as to form a concave-convex structure. Thereby, the first nitride semiconductor 12 was exposed on the side face of the concave portion (FIG. 2). After the concave-convex structure was formed as shown in FIG. 2, $SiO_2$ was removed from the upper part of the convex portion. The stripe was formed in the direction perpendicular to the orientation flat face.

Next, the wafer was set in the reactor and at 1050° C., a second nitride semiconductor layer 13 made of undoped GaN was grown to the thickness of about 320 μm using TMG and ammonia as a source of GaN (FIG. 3 and FIG. 4).

After the second nitride semiconductor layer 13 was grown, the wafer was removed out of the reactor, so as to obtain a GaN substrate 30 made of undoped GaN. The sapphire substrate was removed from the resulting GaN substrate 30 and the device structure as described below was grown on the growth surface opposite to the removal surface, as shown in FIG. 5. The thickness of the substrate made of GaN was about 300 μm.

(Undoped n-Type Contact Layer 1: $Al_aGa_{1-a}N$ of the Present Invention)

An undoped n-type contact layer 1 made of undoped $Al_{0.05}Ga_{0.95}N$ was grown to the thickness of 1 μm on the GaN substrate 30, using TMA (trimethylalminium), TMG and ammonia gas as a source gas at 1050° C.

(n-Type Contact Layer 2: $Al_aGa_{1-a}N$ of the Present Invention)

Next, at the same temperature, an n-type contact layer 2 made of $Al_{0.05}Ga_{0.95}N$ doped with Si to $3 \times 10^{18}/cm^3$ was grown to the thickness of 3 μm, using TMA, TMG and ammonia gas as a source gas and a silane gas ($SIH_4$) as an impurity gas.

Now, there were no small cracks in the above-mentioned n-type contact layer (including the n-type contact layer 1), thus the cracks can be prevented well. If there are any small cracks in tha GaN substrate, the small cracks can be prevented from propagating by growing the n-type nitride semiconductor layer 2, so as to grow a device structure having a good crystallinity. The crystallinity was enhanced better in the case that both an n-type contact layer 2 and an undoped n-type contact layer 1 are formed as described above, compared with the case that only the n-type contact layer 2 was formed.

(Crack Preventing Layer 3)

Next, the temperature was decreased to 800° C. A crack preventing layer 3 made of $In_{0.08}Ga_{0.92}N$ doped with Si to $5\times10^{18}/cm^3$ was grown to the thickness of 0.15 μm, using TMG, TMI (trimethylindium) and ammonia gas as a source gas and a silane gas as an impurity gas.

(n-Type Cladding Layer 4)

Next, at 1050° C., A layer made of undoped $Al_{0.14}Ga_{0.86}N$ was grown to the thickness of 25 angstroms using TMA, TMG and ammonia as a source gas. Subsequently, TMA was stopped and B layer made of GaN doped with Si to $5\times10^{18}/cm^3$ was grown to the thickness of 25 angstroms, using a silane gas as an impurity gas. These operations were repeated 160 times, respectively to laminate A layers and B layers to grow an n-type cladding layer 4 of multi-layered film (of a super lattice structure) with a total thickness of 8000 angstroms.

(n-Type Waveguide Layer 5)

Next, at the same temperature, an n-type waveguide layer made of undoped GaN was grown to the thickness of 0.075 μm using TMG and ammonia as a source gas.

(Active Layer 6)

Next, at 800° C., a barrier layer made of $In_{0.01}Ga_{0.99}N$ doped with Si to $5\times10^{18}/cm^3$ was grown to the thickness of 100 angstroms using TMI, TMG and ammonia as a source gas and silane gas as an impurity gas. Subsequently, the silane gas was stopped and an well layer made of undoped $In_{0.11}Ga_{0.89}N$ was grown to the thickness of 50 angstroms. The operation was three times and finally, a barrier layer was laminated, with the result that the active layer 6 in the multiple quantum well structure (MQW) having a total thickness of 550 angstroms was obtained.

(p-Type Electron Confining Layer 7)

Next, at the same temperature, a p-type electron confining layer 7 made of $Al_{0.4}Ga_{0.6}N$ doped with Mg to $1\times10^{19}/cm^3$ was grown to the thickness of 100 angstroms using TMA, TMG and ammonia as a source gas and $Cp_2Mg$ (cyclopentadienylmagnesium) as an impurity gas.

(p-Type Waveguide Layer 8)

Next, at 1050° C., a p-type waveguide layer 8 made of undoped GaN was grown to the thickness of 0.075 μm using TMG and ammonia as a source gas.

This p-type guide layer 8 was an undoped one but due to the diffusion of Mg from the p-type electron confining layer 7, the concentration of Mg was $5\times10^{16}/cm^3$, resulting in showing a p-type conductivity.

(p-Type Cladding Layer 9)

Next, at the same temperature, A layer made of undoped $Al_{0.1}Ga_{0.9}N$ was grown to the thickness of 25 angstroms using TMA, TMG and ammonia as a source gas. Subsequently, TMA was stopped and B layer made of GaN doped with Mg to $5\times10^{18}/cm^3$ was grown to the thickness of 25 angstroms, using $Cp_2Mg$ gas as an impurity gas. Each of these operations was repeated 100 times to laminate A layers and B layers to grow a p-type cladding layer 9 of multi-layered film (of a super lattice structure) with a total thickness of 5000 angstroms.

(p-Type Contact Layer 10)

Next, at the same temperature, a p-type contact layer 10 made of GaN doped with Mg to $1\times10^{20}/cm^3$ was grown to the thickness of 150 angstroms, using TMG and ammonia as a source gas and $Cp_2Mg$ gas as an impurity gas.

After the reaction was completed, the wafer was annealed at 700° C. in nitrogen atmosphere within the reactor, so as to make the p-type layers less resistive.

After annealing, the wafer was removed out of the reactor. A protective film of $SiO_2$ was formed on the top surface of the p-side contact layer which was an uppermost layer and etching was conducted by $SiCl_4$ with RIE (reactive ion etching) apparatus, to expose the surface of the n-side contact layer 2 on which an n-electrode was to be formed, as shown in FIG. 5.

Figure 6A:
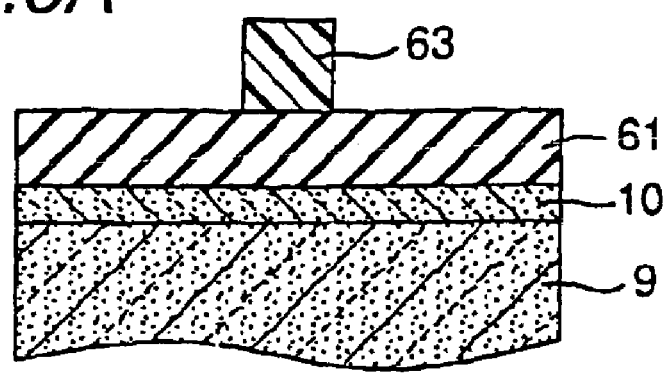
FIGS. 6A to 6F are a partially sectional view showing the process for forming a ridge stripe.

Next, as shown in FIG. 6A, a first protective film 61 made of Si oxide (mainly, $SiO_2$) was formed to the thickness of 0.5 μm on the almost entire surface of the uppermost p-side contact layer 10 with PVD apparatus. Thereafter, a mask of a predetermined shape was placed on the first protective film 61 and a third protective film 63 made of photo resist having a stripe width of 1.8 μm and a thickness of 1 μm was formed.

Figure 6B:
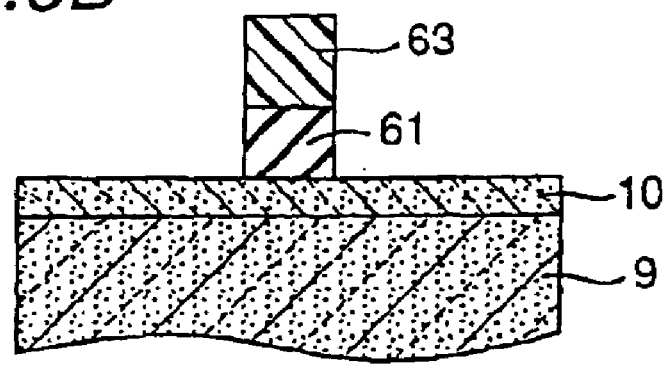
Figure 6C:
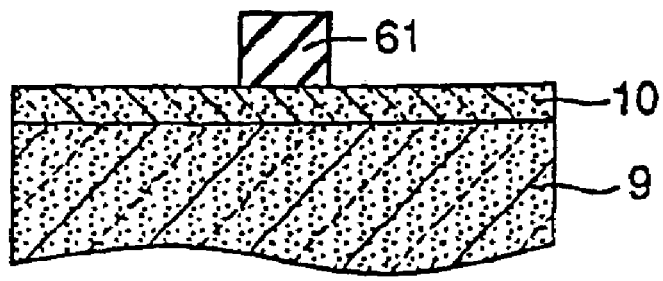

Next, as shown in FIG. 6B, after the third protective film 63 was formed, said first protective film was etched with $CF_4$ gas to have a stripe structure using the third protective film 63 as a mask. Thereafter, only the photo resist was removed by the treatment with an etchant to form a first protective film 61 having a stripe width of 1.8 μm on the p-side contact layer 10, as shown in FIG. 6C.

Figure 6D:
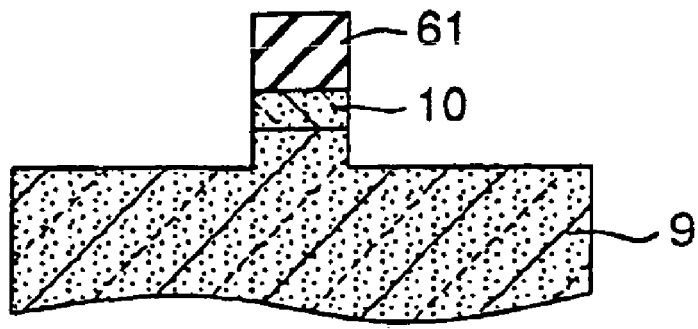

Further, as shown in FIG. 6D, after forming the first protective film 61 of a stripe geometry, the p-side contact layer 10 and the p-side cladding layer 9 were again etched using $SiCl_4$ gas with the RIE to form a ridge stripe having a stripe width of 1.8 μm.

Figure 6E:
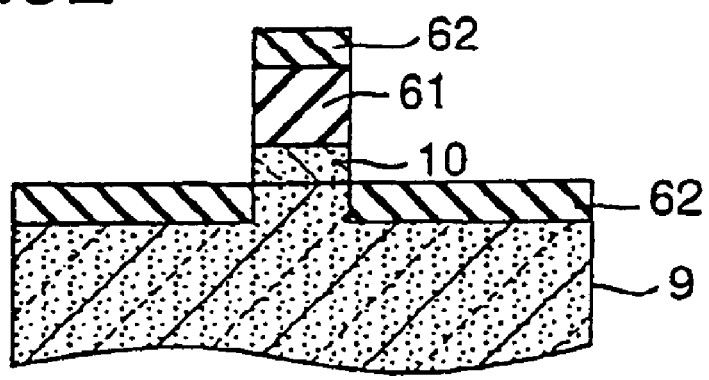

After formation of the ridge stripe, the wafer was transferred into the PVD apparatus, and as shown in FIG. 6E, a second protective film 62 made of Zr oxide (mainly $ZrO_2$) was formed to the thickness of 0.5 μm continuously on the first protective film 61 and on the p-side cladding layer 9 which had been exposed by etching. When the Zr oxide was formed in this way, the insulation of p-n surface can be established and the transverse mode can be stabilized.

Figure 6F:
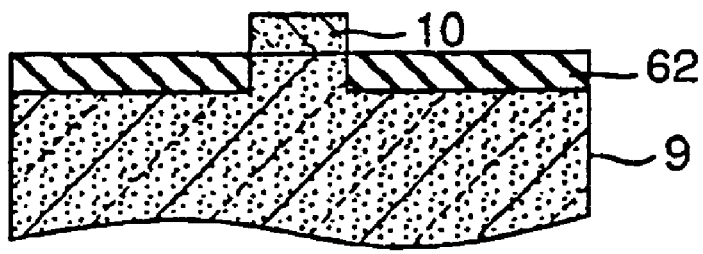

Next, the wafer was soaked in hydrofluoric acid and as shown in FIG. 6F, the first protective film 61 was removed using a lift-off method.

Next, as shown in FIG. 5, a p-electrode 20 made of Ni/Au was formed on the surface of the p-side contact layer 10 which was exposed by removing the first protective film 61 on said p-side contact layer. The p-electrode 20 had a stripe width of 100 μm and was formed in a manner to extend over the second protective film, as shown in this drawing.

After the second protective film 62 was formed, as shown in FIG. 5, an n-electrode 21 made of Ti/Al was formed parallel to the stripe on the exposed n-side contact layer.

The GaN substrate of the resulting wafer on which an n-electrode and a p-electrode were formed in the above-mentioned manner was polished to the thickness of about 100 μm. Thereafter, the wafer was cleaved into bars perpendicularly with respect to the stripe electrode from the substrate to fabricate a resonator on the cleaved facet (11-00 face, which corresponds to the side face of the crystal having a hexagonal pole structure=M face). A dielectric multi-layered film made of $SiO_2$ and $TiO_2$ was formed on the facet of the resonator and finally, the bar was cut parallel to the p-electrode, resulting in a laser device as shown in FIG. 5. The length of the resonator is preferably controlled within the range of 300 to 500 μm.

The resulting laser device was set on the heat sink and each electrode was connected by wire-bonding. The laser oscillation was tried at room temperature.

The continuous oscillation at a wavelength of 500 nm was observed at the threshold current density of 2.5 kA/cm$^2$ and the threshold voltage of 5V at room temperature. The lifetime was ten thousand hours or longer at room temperature.

EXAMPLE 2

The laser device was fabricated in the same manner as in Example 1, except that the undoped n-type contact layer 1 was not grown and only the n-type contact layer 2 was grown.

The resulting device had a crystallinity which was a little worse than that in Example 1. But small cracks could be prevented almost like in Example 1 and good device characteristics could be achieved.

EXAMPLE 3

The laser device was fabricated in the same manner as in Example 1, except that the ratio of Al in the undoped n-type contact layer 1 and the Si-doped n-type contact layer 2 was changed from 0.05 to 0.2.

The resulting device showed good result almost like in Example 1.

EXAMPLE 4

The laser device was fabricated in the same manner as in Example 1, except that the ratio of Al in the undoped n-type contact layer 1 and the Si-doped n-type contact layer 2 was changed from 0.05 to 0.5.

The resulting device had a crystallinity which was a little worse than that in Example 1 because the ratio of Al was larger than in Example 1. But small cracks could be prevented almost like in Example 1 and good device characteristics could be achieved.

EXAMPLE 5

The laser device was fabricated in the same manner as in Example 1, except that the undoped n-type contact layer 1 and the Si-doped n-type contact layer 2 were made of AlN.

The resulting device had a crystallinity which was a little worse than that in Example 1 because the ratio of Al in the n-type contact layer 1 and the n-type contact layer was larger than in Example 1. But small cracks could be prevented almost like in Example 1 and as long a lifetime as in Example 1 could be achieved.

EXAMPLE 6

The laser device was fabricated in the same manner as in Example 1, except that the second nitride semiconductor 13 had a thickness of 15 μm and the sapphire substrate was not removed. The obtained GaN substrate comprised the auxiliary substrate and the nitride semiconductor.

The resulting laser device tended to have a little large warp, compared with in Example 1, but small cracks could be prevented like in Example 1. Since the laser device of Example 6 had an isolating sapphire substrate, the heat radiation property of the device was a little bad, compared with in Example 1. But as long a lifetime as in Example 1 could be achieved.

While the preferred form of the present invention has been described in detail with the reference of the accompanying drawings, various changes and modifications will be apparent to those skilled in the art. It is to be understood that the appended claims cover all such changes and modifications as fall within the true spirit and scope of the invention.

The invention claimed is:

1. A method of manufacturing a nitride semiconductor device, which includes a GaN substrate having a single-crystal GaN layer at least on its surface and plurality of device-forming layers made of nitride semiconductor formed on said GaN layer, comprising the steps of:

forming a first nitride semiconductor layer on an auxiliary substrate made of different material from nitride semiconductor;

forming a stripe-shaped or island-shaped periodical concave-convex structure on said first nitride semiconductor layer;

forming a single-crystal GaN layer to make a GaN substrate; and forming a second nitride semiconductor layer on said GaN substrate, the second nitride semiconductor layer having a coefficient of thermal expansion smaller than that of GaN.

2. The method of manufacturing a nitride semiconductor device according to claim 1, wherein said auxiliary substrate is removed after forming said single-crystal GaN layer to make GaN substrate.

3. The method of manufacturing a nitride semiconductor device according to claim 1, wherein said single-crystal GaN layer being formed through a lateral-growth process and defining the upper surface of said GaN substrate.

4. The method of manufacturing a nitride semiconductor device according to claim 1, wherein said second nitride semiconductor layer prevents small cracks.

5. The method of manufacturing a nitride semiconductor device according to claim 1, wherein said second nitride semiconductor layer is formed directly on the upper surface of said GaN substrate and includes Al.

6. The method of nitride semiconductor device according to claim 1, wherein said second nitride semiconductor layer is made of $Al_aGa_{1-a}N(0<a\leq1)$.

7. The method of manufacturing a nitride semiconductor device according to claim 1 further comprising the steps of:

forming an n-type cladding layer containing Al, an active layer containing InGaN, and p-type cladding layer containing Al on said second nitride semiconductor layer.

8. The method of manufacturing a nitride semiconductor device according to claim 4, wherein said second nitride semiconductor layer has a larger Al content than said GaN layer at the interface with said GaN layer.

* * * * *